United States Patent
Yoon

(10) Patent No.: US 11,209,486 B2
(45) Date of Patent: Dec. 28, 2021

(54) SYSTEM AND METHOD FOR DIAGNOSING CONTACTOR USING SOUND SENSOR

(71) Applicant: LG CHEM, LTD., Seoul (KR)

(72) Inventor: Ho Byung Yoon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 245 days.

(21) Appl. No.: 16/490,435

(22) PCT Filed: Jan. 3, 2018

(86) PCT No.: PCT/KR2018/000087
§ 371 (c)(1),
(2) Date: Aug. 30, 2019

(87) PCT Pub. No.: WO2018/230795
PCT Pub. Date: Dec. 20, 2018

(65) Prior Publication Data
US 2020/0033410 A1    Jan. 30, 2020

(30) Foreign Application Priority Data

Jun. 13, 2017 (KR) .................... 10-2017-0073857

(51) Int. Cl.
*G01R 31/327* (2006.01)
*G01H 3/00* (2006.01)
(Continued)

(52) U.S. Cl.
CPC ........... *G01R 31/3277* (2013.01); *G01H 1/00* (2013.01); *G01H 3/00* (2013.01); *G01H 11/06* (2013.01);
(Continued)

(58) Field of Classification Search
CPC .......... G01H 1/00; G01H 11/06; G01H 17/00; G01H 3/00; G01R 31/302; G01R 31/327;
(Continued)

(56) References Cited

U.S. PATENT DOCUMENTS 4,698,621 A * 10/1987 Masot .................... H01H 71/04
340/639
4,706,073 A * 11/1987 Masot .................... H01H 71/04
340/639
(Continued)

FOREIGN PATENT DOCUMENTS

CN      104569799 A     4/2015
CN      205691742 U     11/2016
(Continued)

OTHER PUBLICATIONS

Machine translation WO2018230795A1 (Year: 2021).*
(Continued)

*Primary Examiner* — David L Singer
(74) *Attorney, Agent, or Firm* — Birch, Stewart, Kolasch & Birch, LLP

(57) ABSTRACT

A system and a method of diagnosing a contactor through a sound sensor, which determines whether a contactor is erroneously operated based on a result of sensing a mechanical transition sound generated during an on/off operation of the contactor. The contactor diagnosis may be applied to a battery management system and may further include counting the number of transition operations of the contactor and/or may be used for diagnosing the life of the contactor.

6 Claims, 4 Drawing Sheets

(51) Int. Cl.
    *G01H 1/00*     (2006.01)
    *G01H 11/06*     (2006.01)
    *G01R 31/302*     (2006.01)

(52) U.S. Cl.
    CPC ......... *G01R 31/302* (2013.01); *G01R 31/327* (2013.01)

(58) Field of Classification Search
    CPC ............ G01R 31/3275; G01R 31/3277; H01H 11/0062; H01H 2071/044; H01H 71/04; H02H 1/0023
    See application file for complete search history.

(56) References Cited

U.S. PATENT DOCUMENTS

| | | | | |
|---|---|---|---|---|
| 4,975,800 | A * | 12/1990 | Oshita | G01R 31/3274 324/520 |
| 5,844,493 | A * | 12/1998 | Pohl | H02H 3/04 340/657 |
| 6,215,408 | B1 * | 4/2001 | Leonard | G01R 31/3274 324/415 |
| 8,065,916 | B2 | 11/2011 | Yanohara et al. | |
| 2005/0195548 | A1 * | 9/2005 | Pancke | H02H 3/04 361/115 |
| 2009/0114020 | A1 * | 5/2009 | Yanohara | G01M 13/045 73/593 |
| 2010/0153022 | A1 * | 6/2010 | Chen | G01R 31/3277 702/34 |
| 2012/0024677 | A1 * | 2/2012 | Safreed, III | H01H 9/20 200/50.24 |
| 2012/0092965 | A1 * | 4/2012 | Zhou | G01R 31/1209 367/135 |
| 2013/0009648 | A1 | 1/2013 | Tae | |
| 2013/0342292 | A1 | 12/2013 | Choi et al. | |
| 2014/0055886 | A1 * | 2/2014 | Spangenberg | H02H 7/222 361/2 |
| 2014/0069195 | A1 * | 3/2014 | Ledbetter | G01H 1/00 73/649 |
| 2015/0115972 | A1 | 4/2015 | Park | |
| 2016/0146901 | A1 * | 5/2016 | Ohta | G01R 31/3278 324/538 |
| 2017/0045481 | A1 * | 2/2017 | Benke | H01H 71/04 |
| 2017/0047174 | A1 * | 2/2017 | Chen | H01H 3/26 |

FOREIGN PATENT DOCUMENTS

| | | |
|---|---|---|
| CN | 106646205 A | 5/2017 |
| JP | H06-36661 A | 2/1994 |
| JP | 2007-273157 A | 10/2007 |
| JP | 2007-300234 A | 11/2007 |
| JP | 2010-161009 A | 7/2010 |
| JP | 2013-200143 A | 10/2013 |
| JP | 2013-257969 A | 12/2013 |
| JP | 5455298 B2 | 3/2014 |
| JP | 2016-044018 A | 4/2016 |
| KR | 10-2009-0010430 A | 1/2009 |
| KR | 10-2016-0089558 A | 7/2016 |
| KR | 10-1687869-81 | 12/2016 |

OTHER PUBLICATIONS

International Search Report for PCT/KR2018/000087 (PCT/ISA/210) dated Apr. 16, 2018, with English translation.
Search Report of European Patent Office in Application No. 18817592.1, dated Jan. 24, 2020.

* cited by examiner

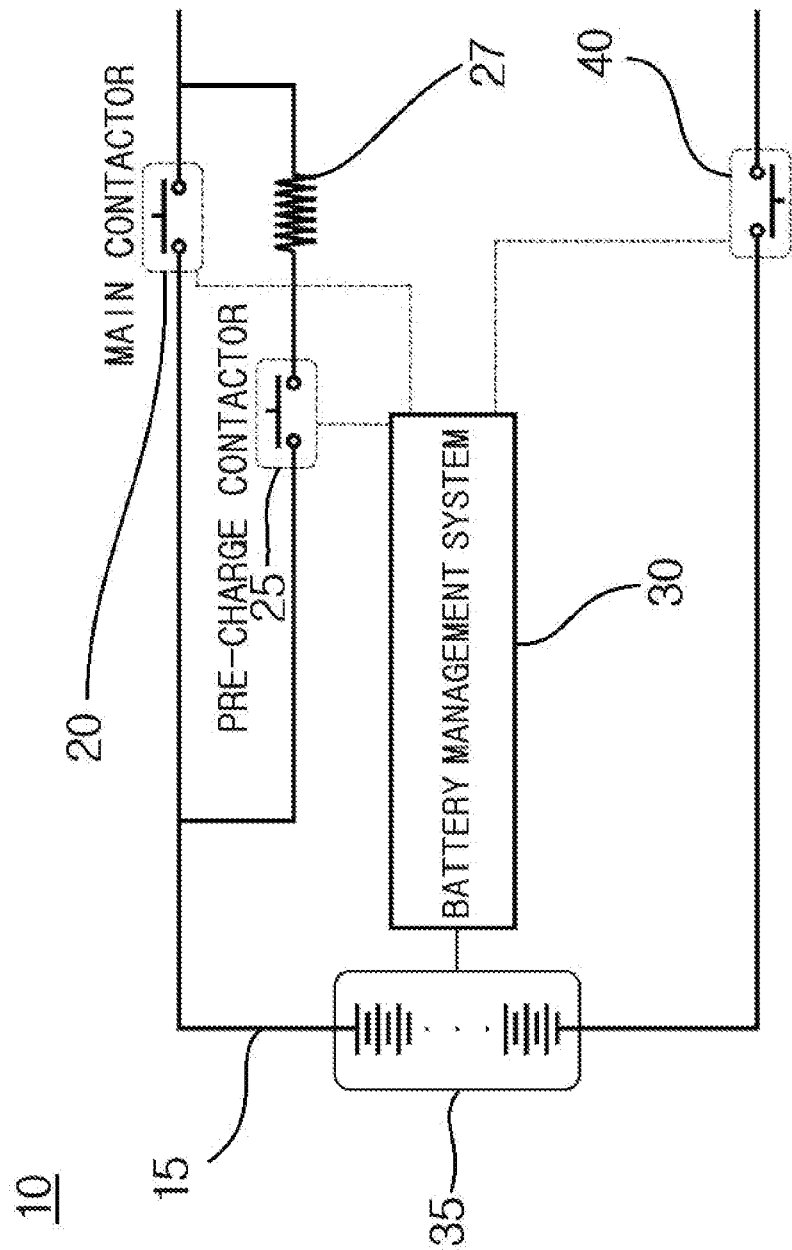
[Figure 1]
Prior Art

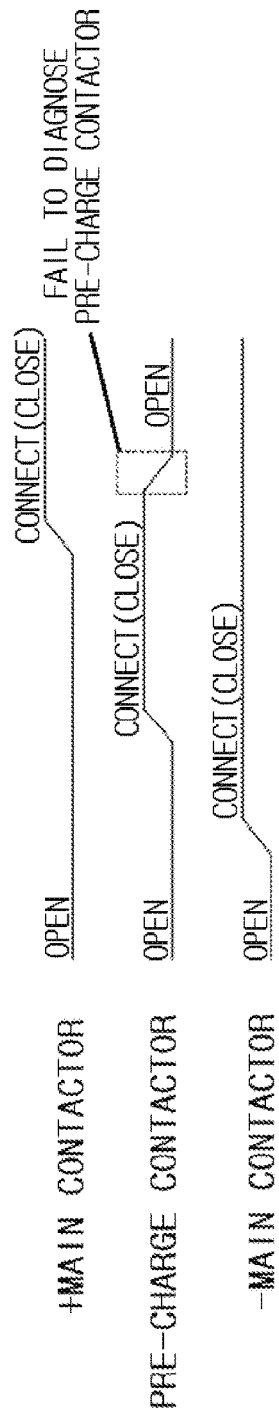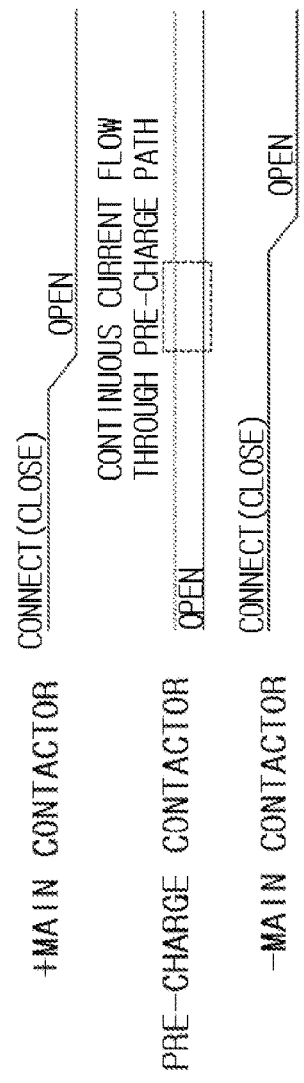
[Figure 2]
Prior Art

[Figure 3]
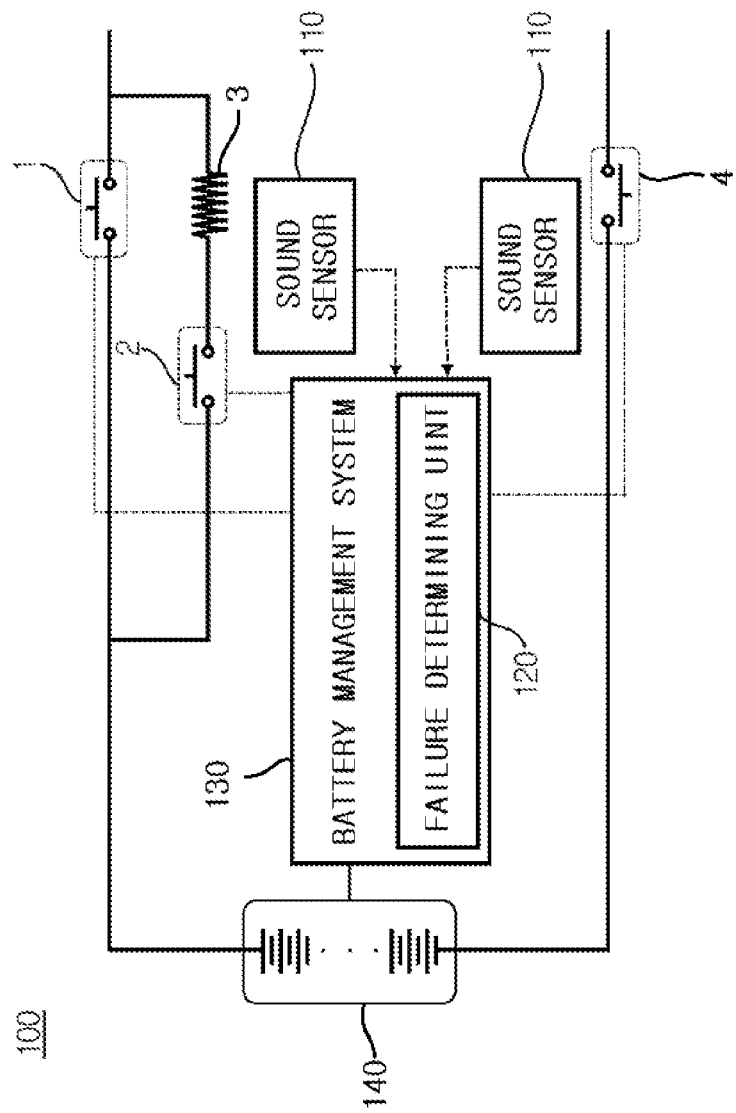

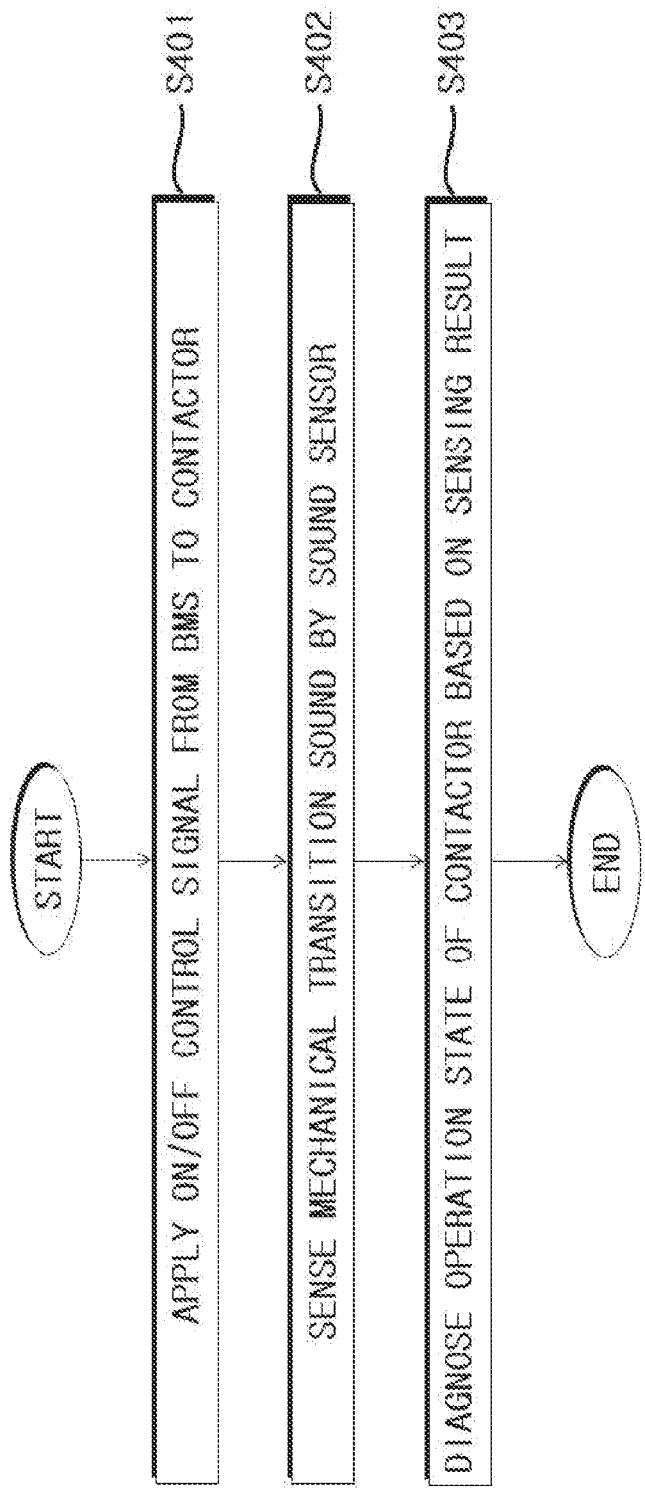

SYSTEM AND METHOD FOR DIAGNOSING CONTACTOR USING SOUND SENSOR

TECHNICAL FIELD

This application claims priority to and the benefit of Korean Patent Application No. 10-2017-0073857 filed in the Korean Intellectual Property Office on Jun. 13, 2017, the entire contents of which are incorporated herein by reference.

The present invention relates to a system and a method of diagnosing a contactor through a sound sensor, and more particularly, to a system and a method of diagnosing a contactor through a sound sensor, which sense a mechanical transition sound generated during an on/off operation of a contactor provided on a battery management system (BMS) circuit and determine whether the contactor is erroneously operated based on a sensing result, thereby handling damage to the contactor due to the erroneous operation of the contactor, and which count and record the number of times of the transition sound, thereby managing a life of the contactor.

BACKGROUND ART

Recently, in order to decrease use of an internal combustion engine and use eco-friendly electric energy, vehicles mounted with large-capacity batteries have been released.

In the meantime, a battery used in an electric vehicle has a voltage of about 350 V to 400 V, and the battery is connected with a load (an inverter and the like) via a contactor, and when the contactor is turned on in the state where an input capacitor of the load is discharged, the large quantity of surge current momentarily flows in the contactor, so that the contactor may be damaged.

Accordingly, in order to prevent damage to the contactor, a precharge circuit formed of a pre-charge contactor and a resistor which are serially connected with a contactor is currently used, so that a current is supplied through the pre-charge circuit in advance before the main contactor is turned on, thereby protecting the main contactor.

However, in this case, the pre-charge circuit is turned off after the capacitor is charged, but the pre-charge contactor is connected with the main contactor in parallel, so that there is a problem in that it is difficult to diagnose a situation in which the pre-charge circuit is turned off. Particularly, when welding is generated due to failure in the pre-charge contactor, there is concern that a battery is discharged through the pre-charge circuit, and heat is generated through a resistor, so that there is concern that energy is continuously consumed and performance is continuously degraded.

In this respect, in order to solve the aforementioned various problems and limits generated during a process of diagnosing a contactor through a pre-charge circuit in the related art, the present inventors developed a system and a method of diagnosing a contactor through a sound sensor, which sense a mechanical transition sound generated during an on/off operation of a contactor provided on a battery management system (BMS) circuit and determine whether the contactor is erroneously operated based on a sensing result, thereby handling damage to the erroneous operation of the contactor, and which count and record the number of times of the transition sound, thereby managing a life of the contactor.

DETAILED DESCRIPTION OF THE INVENTION

Technical Problem

The present invention is conceived to solve the foregoing problems, and provides a system and a method of diagnosing a contactor through a sound sensor, which sense a mechanical transition sound generated during an on/off operation of a contactor provided on a battery management system (BMS) circuit and determine whether the contactor is erroneously operated based on a sensing result, thereby handling damage to the contactor due to the erroneous operation of the contactor, and which count and record the number of times of the transition sound, thereby managing a life of the contactor.

Technical Solution

An exemplary embodiment of the present invention provides a system for diagnosing a contactor, the system including: a sound sensor adjacently positioned to the contactor on a battery management system (BMS) circuit; and a failure determining unit which determines whether the contactor is erroneously operated based on a sensing result output from the sound sensor.

In the exemplary embodiment, a contactor control signal applied from the BMS to the contactor and the sound sensor may sense a mechanical transition sound generated during an on or off operation of the contactor, and when the mechanical transition sound is different from a predetermined mechanical transition sound, the failure determining unit may determine that failure is generated in the contactor.

In the exemplary embodiment, the BMS circuit may be electrically connected with a main contactor and a pre-charge contactor, and the sound sensor may be adjacently positioned to each of the main contactor and the pre-charge contactor.

In the exemplary embodiment, the sound sensor may count the number of times of the mechanical transition sound generated during the on or off operation of the contactor.

In the exemplary embodiment, a contactor control signal is applied from the BMS to the contactor and the failure determining unit may determine whether the contactor is erroneously operated and the contactor control signal is erroneously operated based on the contactor control signal applied from the BMS to the contactor and the sensing result output from the sound sensor.

Another exemplary embodiment of the present invention provides a method of diagnosing a contactor through a sound sensor, the method including: sensing a mechanical transition sound generated during an on or off operation of a contactor through a sound sensor adjacently positioned to the contactor on a battery management system (BMS) circuit; and determining, by a failure determining unit, whether the contactor is erroneously operated based on a sensing result output from the sound sensor.

Advantageous Effects

According to one aspect of the present invention, it is possible to sense a mechanical transition sound generated during an on/off operation of a contactor provided on a battery management system (BMS) circuit and determine whether the contactor is erroneously operated based on the sensing result, so that there is an advantage in that it is possible to handle damage to the contactor due to the erroneous operation of the contactor.

Particularly, according to the aspect of the present invention, when a contactor has an operational defect, whether the operation of the contactor is diagnosed through the sound sensor, so that it is possible to determine whether the contactor has failure or a connection line of the contactor has failure.

Further, according to the exemplary embodiment of the present invention, when the BMS records the number of times of an on/off operation of the contactor and manages a life of the contactor, the BMS counts the number of times of a transition sound and then transmits the counted number of times of the transition sound to the BMS, so that there is an advantage in that it is possible to improve reliability through a double-check for the number of times of the on/off operation of the contactor.

BRIEF DESCRIPTION OF DRAWINGS

FIG. 1 is a diagram illustrating a configuration in which a precharge contactor and a main contactor are controlled through a battery management system (BMS) in the related art.

FIG. 2 is a diagram illustrating a sequence generated during an on/off operation of the contactor in the related art illustrated in FIG. 1.

FIG. 3 is a diagram illustrating a configuration of a system 100 for diagnosing a contactor through a sound sensor according to an exemplary embodiment of the present invention.

FIG. 4 is a diagram sequentially illustrating a process of diagnosing an erroneous operation of a contactor through the system 100 for diagnosing a contactor through a sound sensor illustrated in FIG. 3.

MODE FOR CARRYING OUT THE INVENTION

Hereinafter, an exemplary embodiment is presented for helping understanding of the present invention. However, the exemplary embodiment below is simply provided for easier understanding of the present invention, and the contents of the present invention are not limited by the exemplary embodiment.

FIG. 1 is a diagram illustrating a configuration 10 in which a precharge contactor 25 and a main contactor 20 are controlled through a battery management system (BMS) 30 in the related art, and FIG. 2 is a diagram illustrating a sequence generated during an on/off operation of the contactor in the related art illustrated in FIG. 1. Referring to FIG. 1, a BMS 30 is provided on a circuit 15 connected with a battery 35, and positive-electrode and negative-electrode main contactors provided on the circuit 15 and a pre-charge circuit 25, 27 (including a pre-charge contactor 25 and a resistor 27) provided at a front end of the positive-electrode main contactor 20 are connected with the BMS 30 and are controlled through a control signal from the BMS 30.

In this case, when the pre-charge circuit 25, 27 is turned off after a capacitor (not illustrated) provided on the circuit 15 is charged, the pre-charge contactor 25 and the main contactor 20 are connected with each other in parallel, so that there is a problem in that it is difficult to diagnose the situation in which the pre-charge contactor 25 is turned off, and further, when welding is generated due to failure of the pre-charge contactor 25, a battery 35 may be continuously discharged through the pre-charge circuit 25, 27, and heat is generated through a resistor 27, so that there is concern that energy is consumed and performance of the battery 35 is degraded.

Referring to FIG. 2, when the main contactor is connected (close) after the capacitor is charged in the related art, even though the pre-charge contactor is open, the main contactor and the pre-charge contactor are connected with each other in parallel, so that it is impossible to diagnose whether the pre-charge contactor is open.

Further, in the related art, when welding is generated in the pre-charge contactor, even though the main contactor is open, a current continuously flows through a pre-charge path, which causes continuous consumption of energy.

Accordingly, in the present invention, a system 100 and a method of diagnosing a contactor through a sound sensor which are capable of solving the problems and the limits in the related art will be described with reference to FIGS. 3 and 4.

FIG. 3 is a diagram illustrating a configuration of a system 100 for diagnosing at least one contactor 1 through a sound sensor 110 according to an exemplary embodiment of the present invention.

Referring to FIG. 3, the system 100 for diagnosing at least one contactor through a sound sensor according to the exemplary embodiment of the present invention may generally include at least one sound sensor 110 and a failure determining unit 120.

First, the at least one sound sensor 110 may be adjacently positioned to a contactor 1, 2, more particularly, a main contactor 1 and a pre-charge contactor 2, on a circuit connected with a battery management system (BMS) 130, and serve to sense a mechanical transition sound generated during on or off operations of the main contactor 1 and the pre-charge contactor 2 and transmit the sensed mechanical transition sound to the failure determining unit 120 which is to be described below. Further, the BMS 130 is provided on a circuit connected with a battery 140.

The at least one sound sensor 110 may also count the number of times the mechanical transition sound is generated during the on or off operations of the main contactor 1 and the pre-charge contactor 2, and herein, the mechanical transition sound may be a mechanical sound generated when physical states of the main contactor 1 and the pre-charge contactor 2 are changed from the on-state to the off-state or from the off-state to the on-state, and the at least one sound sensor 110 may diagnose operation states of the main contactor 1 and the pre-charge contactor 2 through the mechanical transition sound.

The generated mechanical transition sound is transmitted to the failure determining unit 120 which is to be described below through the at least one sound sensor 110 and the failure determining unit 120 records the number of times of the mechanical transition sound, so that the mechanical transition sound may be used for managing a life of the main contactor 1 and the pre-charge contactor 2. Further, in the exemplary embodiment, the main contactor 1 and the pre-charge contactor 2 are closely positioned, so that one sound sensor 110 may be applied to the main contactor 1 and the pre-charge contactor 2. Further, a second sound sensor 110 may be utilized, the additional sound sensor 110 being positioned next to a second main contactor 4.

Next, the failure determining unit 120 may serve to determine whether the main contactors 1, 4 and the pre-charge contactor 2 are erroneously operated based on the sensing result output (transmitted) from the respective sound sensor 110.

More particularly, the failure determining unit 120 may be included in the BMS 130, and when a mechanical transition sound generated during the on or off operations of the main contactor 1 and the pre-charge contactor 2 is different from a predetermined mechanical transition sound, the failure determining unit 120 may determine that failure is generated in the corresponding contactor 1, 2, and particularly, the failure determining unit 120 may determine whether the main contactor 1 and the pre-charge contactor 2 are erroneously operated and whether an on/off control signal applied from the BMS 130 is erroneously operated based on an on/off control signal applied from the BMS 130 to the main contactor 1 and the pre-charge contactor 2 and the sensing result output through the sound sensor 110.

Particularly, the failure determining unit 120 may determine whether the main contactor 1 and the pre-charge contactor 2 are properly operated in accordance with the on/off control signal applied from the BMS 130 based on the sensing result of the sound sensor 110, and when it fails to control the main contactor 1 and the pre-charge contactor 2, the failure determining unit 120 may determine whether failure is generated in the main contactor 1 and the pre-charge contactor 2 and whether failure is generated in a control signal path.

Next, a process of diagnosing an erroneous operation of the contactor will be described with reference to FIG. 4.

FIG. 4 is a diagram sequentially illustrating a process of diagnosing an erroneous operation of a contactor through the system 100 for diagnosing a contactor through a sound sensor illustrated in FIG. 3.

Referring to FIG. 4, the BMS applies an on/off control signal to the main contactor and the pre-charge contactor (S401), and the main contactor and the pre-charge contactor are operated in accordance with the applied on/off control signal.

In this case, the sound sensor senses a mechanical transition sound of the main contactor and the pre-charge contactor (S402), and outputs (transmits) the sensing result to the failure determining unit within the BMS.

Then, the failure determining unit determines whether the main contactor and the pre-charge contactor are normally operated based on the on/off control signal applied from the BMS and the sensing result output from the sound sensor (S403).

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. A system for diagnosing at least one contactor, the system comprising:
 a battery management system (BMS) circuit including a BMS;
 at least one sound sensor adjacent to a respective contactor among the at least one contactor, each sound sensor being configured to sense a mechanical transition sound generated during an on or off operation of the respective contactor; and
 a failure determining unit which determines whether each of the at least one contactor is erroneously operated based on a sensing result output from each sound sensor,
 wherein in response to the sensed mechanical transition sound being different from a predetermined mechanical transition sound, the failure determining unit is configured to determine that failure is generated in the at least one contactor,
 wherein the at least one contactor includes a main contactor and a pre-charge contactor,
 wherein the BMS is configured to record a number of times of an on/off operation of the at least one contactor,
 wherein the failure determining unit is configured to:
 count a number of the mechanical transition sounds based the sensing result output from each sound sensor, and
 wherein the BMS or the failure determining unit is configured to compare the number of times of the on/off operation for each contactor with the number of the mechanical transition sounds of each contactor to determine if each contactor is erroneously operated.

2. The system of claim 1, wherein the BMS circuit is electrically connected with the main contactor and with the pre-charge contactor.

3. The system of claim 1, wherein at least one contactor control signal is applied from the BMS to the at least one contactor, and
 wherein the failure determining unit determines whether the at least one contactor is erroneously operated and the at least one contactor control signal is erroneously operated based on the at least one contactor control signal applied from the BMS to the at least one contactor and the sensing result output from the respective sound sensor.

4. A method of diagnosing at least one contactor, the method comprising:
 providing:
 a battery management system (BMS) circuit including a BMS;
 at least one sound sensor adjacent to a respective contactor among the at least one contactor; and
 a failure determining unit;
 sensing, by each sound sensor, a mechanical transition sound generated during an on or off operation of the at least one contactor; and
 determining, by the failure determining unit, whether the at least one contactor is erroneously operated based on a sensing result output from each sound sensor,
 wherein in response to the mechanical transition sound being different from a predetermined mechanical transition sound, the failure determining unit determines that failure is generated in the at least one contactor,
 wherein the at least one contactor includes a main contactor and a pre-charge contactor, and
 wherein the method further comprises:
 recording, by the BMS, a number of times of an on/off operation of the at least one contactor;
 counting, by the failure determining unit, a number of the mechanical transition sounds based the sensing result output from each sound sensor; and
 comparing, by the failure determining unit or the BMS, the number of times of the on/off operation for each contactor with the number of transition sounds of each contactor to determine if each contactor is erroneously operated.

5. The method of claim 4, wherein the BMS circuit is electrically connected with the main contactor and with the pre-charge contactor.

6. The method of claim 4, wherein at least one contactor control signal is applied from the BMS to the at least one contactor, and wherein the failure determining unit determines whether the at least one contactor is erroneously operated and the at least one contactor control signal is erroneously operated based on the at least one contactor control signal applied from the BMS to the at least one contactor and the sensing result.

* * * * *